(12) United States Patent
Lee et al.

(10) Patent No.: US 12,170,191 B2
(45) Date of Patent: Dec. 17, 2024

(54) SUBSTRATE SUPPORTING APPARATUS AND SUBSTRATE TREATING APPARATUS INCLUDING THE SAME

(71) Applicant: SEMES CO., LTD., Chungcheongnam-do (KR)

(72) Inventors: Jong Gun Lee, Chungcheongnam-do (KR); So Hyung Jiong, Chungcheongnam-do (KR); Hyung Joon Kim, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 185 days.

(21) Appl. No.: 18/078,958

(22) Filed: Dec. 11, 2022

(65) Prior Publication Data

US 2024/0038508 A1 Feb. 1, 2024

(30) Foreign Application Priority Data

Jul. 29, 2022 (KR) .......................... 10-2022-0094780

(51) Int. Cl.
*H01J 37/32* (2006.01)
*H01L 21/683* (2006.01)

(52) U.S. Cl.
CPC .. *H01J 37/32724* (2013.01); *H01J 37/32577* (2013.01); *H01L 21/6833* (2013.01)

(58) Field of Classification Search
CPC ........... H01J 37/32577; H01J 37/33715; H01J 37/32724; H01L 21/6833; H01L 21/67103; H01L 21/67109

USPC ........................................................ 361/234
See application file for complete search history.

(56) References Cited

U.S. PATENT DOCUMENTS

| | | | |
|---|---|---|---|
| 10,083,853 B2 | 9/2018 | Matyushkin et al. | |
| 11,024,532 B2 | 6/2021 | Matyushkin et al. | |
| 11,532,497 B2 | 12/2022 | Cho et al. | |
| 11,651,991 B2 | 5/2023 | Matyushkin et al. | |
| 2017/0110356 A1* | 4/2017 | Matyushkin | H01J 37/32577 |
| 2017/0352567 A1* | 12/2017 | Cho | H01J 37/32724 |

(Continued)

FOREIGN PATENT DOCUMENTS

| | | |
|---|---|---|
| JP | 2019-522889 | 8/2019 |
| KR | 10-2017-0054240 | 5/2017 |

(Continued)

OTHER PUBLICATIONS

Office Action dated Feb. 20, 2024 for Japanese Patent Application No. 2022-202786 and its English translation from Global Dossier.

(Continued)

*Primary Examiner* — Kevin J Comber
(74) *Attorney, Agent, or Firm* — Womble Bond Dickinson (US) LLP

(57) ABSTRACT

Provided is a substrate supporting apparatus with improved durability. The substrate supporting apparatus includes a body configured to support a substrate and formed of a dielectric substance; a heat transfer medium supply hole installed to penetrate the body; a first electrostatic electrode disposed in the body; and a second electrostatic electrode disposed in the body, located on the first electrostatic electrode, and electrically connected to the first electrostatic electrode.

13 Claims, 6 Drawing Sheets

(56) References Cited

U.S. PATENT DOCUMENTS

2023/0072594 A1   3/2023   Cho et al.

FOREIGN PATENT DOCUMENTS

KR   10-1748195   6/2017
KR   10-1876501   7/2018

OTHER PUBLICATIONS

Office Action dated Mar. 8, 2024 for Korean Patent Application No. 10-2022-0094780 and its English translation from Global Dossier.

* cited by examiner

SUBSTRATE SUPPORTING APPARATUS AND SUBSTRATE TREATING APPARATUS INCLUDING THE SAME

CROSS-REFERENCE TO RELATED APPLICATION

This application claims priority from Korean Patent Application No. 10-2022-0094780 filed on Jul. 29, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a substrate supporting apparatus and a substrate treating apparatus including the same.

2. Description of the Related Art

To fabricate a semiconductor device or a display device, it is necessary to perform several processes such as photolithography, etching, ashing, ion-implantation, thin-film deposition, and cleaning processes. Here, the etching process is a process of removing a part of an etch target film formed on a substrate, and may include wet etching using an etching solution and dry etching using plasma.

Plasma refers to an ionized gaseous state including ions, electrons, and radicals. The plasma is generated by very high temperature, strong electric fields, or radio frequency (RF) electromagnetic fields. A part of an etch target film formed on a substrate is removed as ion particles contained in the plasma collide with the substrate.

A helium supply hole through which a helium gas is supplied to a lower surface of the substrate is provided in an electrostatic chuck (ESC). When a high level of bias power is applied to the ESC, arching may occur in the helium supply hole. When the size of the helium supply hole is reduced, the probability of arching may be reduced as a breakdown voltage is raised, but it is difficult to process the helium supply hole and manufacturing cost is increased. Thus, there is a need to develop a substrate supporting apparatus with a low manufacturing cost in which arching does not occur even when a high level of bias power is applied.

SUMMARY

Aspects of the present disclosure provide a substrate support apparatus with improved durability.

Aspects of the present disclosure also provide a substrate treating apparatus including a substrate supporting apparatus with improved durability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a substrate supporting apparatus including: a body configured to support a substrate and formed of a dielectric substance; a heat transfer medium supply hole installed to penetrate the body; a first electrostatic electrode disposed in the body; and a second electrostatic electrode disposed in the body, located on the first electrostatic electrode, and electrically connected to the first electrostatic electrode.

According to another aspect of the present disclosure, there is provided a substrate supporting apparatus including: a body configured to support a substrate and formed of a dielectric substance; and a lower plate disposed below the body, fixed to the body by a bonding layer, and formed of a metallic material, wherein a first electrostatic electrode, a second electrostatic electrode positioned on the first electrostatic electrode, a via in direct contact with the first electrostatic electrode and the second electrostatic electrode, a heat transfer medium supply hole configured to penetrate the first electrostatic electrode and the second electrostatic electrode are installed in an interior of the body, a cooling passage through which a cooling fluid circulates is installed in an interior of the lower plate, and a first distance from the first electrostatic electrode to a bottom surface of the body is the same as a second distance from the second electrostatic electrode to an upper surface of the body.

According to still another aspect of the present disclosure, there is provided a substrate treating apparatus including: a housing; a substrate supporting unit provided in an interior of the housing and configured to support a substrate; a gas supply unit configured to provide a process gas into the housing; and a plasma source having an electrode configured to be applied a radio frequency (RF) current and generate plasma using the process gas, wherein the substrate supporting unit includes a body configured to support a substrate and formed of a dielectric substance, a heat transfer medium supply hole installed to penetrate the body, a first electrostatic electrode disposed in the body, and a second electrostatic electrode disposed in the body, located on the first electrostatic electrode, and electrically connected to the first electrostatic electrode.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
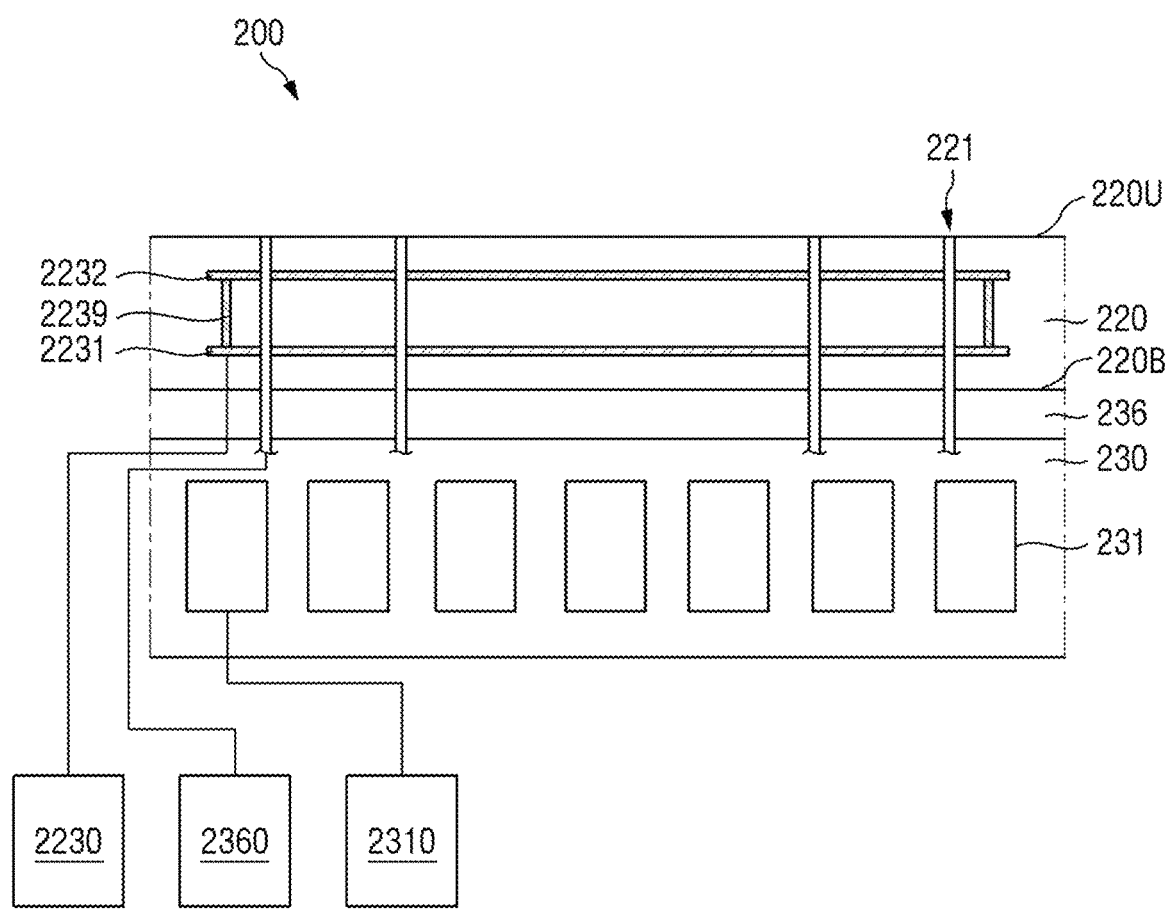
FIG. 1 is a cross-sectional view of a substrate supporting apparatus according to a first embodiment of the present disclosure.

Hereinafter, embodiments of the present disclosure will be described with reference to the attached drawings.

Hereinafter, preferred embodiments of the present disclosure will be described in detail with reference to the accompanying drawings. Advantages and features of the present disclosure and methods of accomplishing the same may be understood more readily by reference to the following detailed description of preferred embodiments and the accompanying drawings. The present disclosure may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Hereinafter, exemplary embodiments of the present disclosure will be described in detail with reference to the accompanying drawings. In the description with reference to the drawings, the same or corresponding elements are denoted by the same reference numerals, and a redundant description thereof will be omitted.

Figure 2:
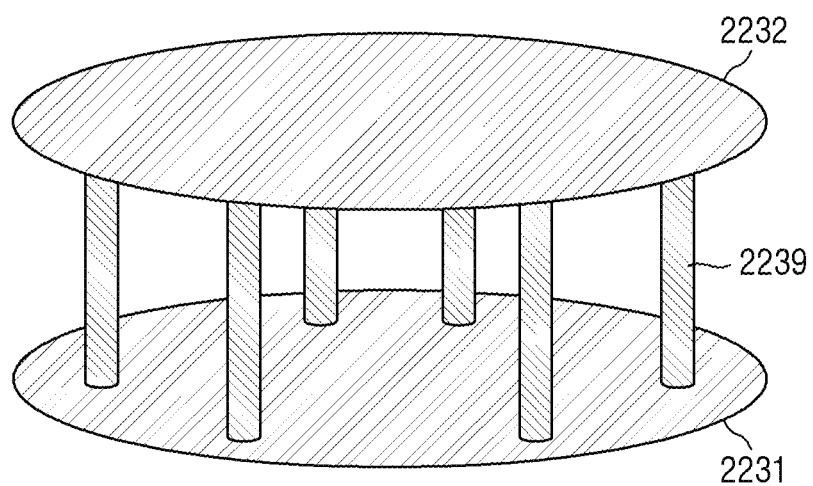
FIG. 2 is a conceptual diagram illustrating a first electrostatic electrode, a second electrostatic electrode, and a via illustrated in FIG. 1.
Figure 3:
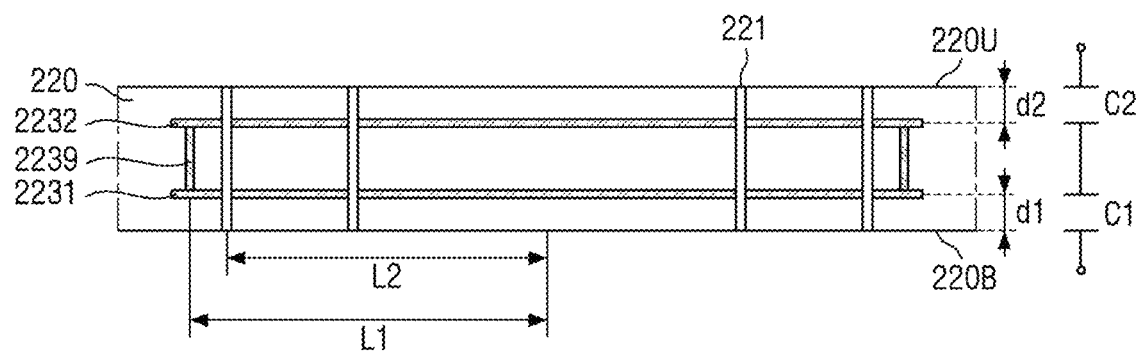
FIG. 3 is a diagram for explaining capacitance in the substrate supporting apparatus shown in FIG. 1.
Figure 4:
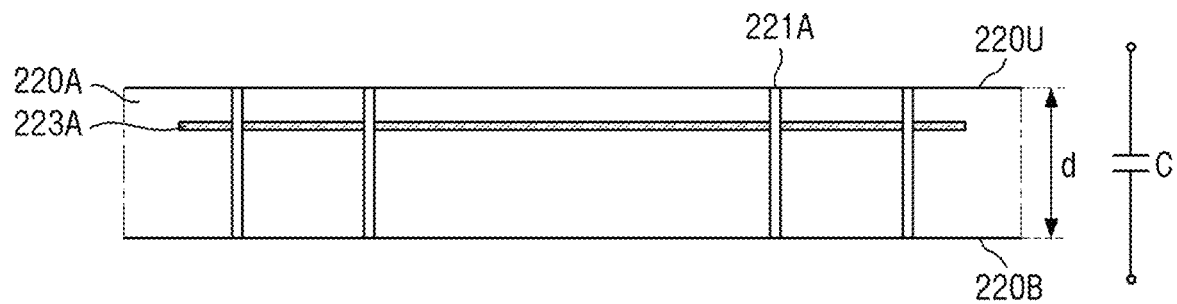
FIG. 4 is a diagram for describing capacitance in a substrate supporting apparatus using one layer of an electrostatic electrode.

FIG. 1 is a cross-sectional view of a substrate supporting apparatus according to a first embodiment of the present disclosure. FIG. 2 is a conceptual diagram illustrating a first electrostatic electrode, a second electrostatic electrode, and a via illustrated in FIG. 1. FIG. 3 is a view for describing capacitance in the substrate supporting apparatus shown in FIG. 1, and FIG. 4 is a view for describing capacitance in a substrate supporting apparatus using one layer of an electrostatic electrode.

First, referring to FIGS. 1 and 2, a substrate supporting apparatus 200 according to a first embodiment includes a body 220, a lower plate 230, and a bonding layer 236.

The lower plate 230 is made of a metallic material (e.g., aluminum), and located below the body 220. A cooling passage 231 through which a cooling fluid circulates is installed in the lower plate 230. The cooling fluid cools the lower plate 230 while circulating the cooling passage 231. The cooling passage 231 is connected to a cooling fluid supply unit 2310.

The body 220 may be bonded to the lower plate 230 through the bonding layer 236. The bonding layer 236 may be made of an insulating material, but is not limited thereto.

Although not separately illustrated, an electrode which is supplied with bias power may be installed in the lower plate 230, installed in the bonding layer 236, or installed in the body 220. The bias power may be configured by a radio frequency (RF) power source.

The body 220 is made of a dielectric material (e.g., ceramic), and supports the substrate.

A heat transfer medium supply hole 221 is installed to penetrate the body 220. The heat transfer medium supply hole 221 may be installed in a central region and/or an edge region of the body 220. The heat transfer medium supply hole 221 may be connected to a heat transfer medium supply unit 2360. A heat transfer medium provided from the heat transfer medium supply unit 2360 is provided to a lower surface of the substrate through the heat transfer medium supply hole 221. The heat transfer medium may be an inert gas, e.g., helium (He), but is not limited thereto. The heat transfer medium may serve as a medium through which heat transferred from the plasma to the substrate is transferred to the substrate supporting apparatus 200.

A first electrostatic electrode 2231 and a second electrostatic electrode 2232 are electrically connected thereto and installed in the body 220. The first electrostatic electrode 2231 and the second electrostatic electrode 2232 are provided with a constant voltage (DC) from a static voltage providing unit 2230. As illustrated, the first electrostatic electrode 2231 and the second electrostatic electrode 2232 may be spaced apart and stacked on top of each other. In addition, the first electrostatic electrode 2231 may be disposed close to a bottom surface 220B of the body 220, and the second electrostatic electrode 2232 is disposed close to an upper surface 220U of the body 220. In order to electrically connect the first electrostatic electrode 2231 to the second electrostatic electrode 2232, vias in direct contact with the first electrostatic electrode 2231 and the second electrostatic electrode 2232 may be installed. As shown in FIG. 2, the vias 2239 may be disposed along outer circumferential surfaces of the first electrostatic electrode 2231 and the second electrostatic electrode 2232, but the present disclosure is not limited thereto.

The capacitance of the body 220 may be increased by using the electrostatic electrodes 2231 and 2232 that are electrically connected, spaced apart, and stacked on top of each other. Accordingly, the impedance of the body 220 may be reduced.

Specifically, referring to FIG. 3, by electrically connecting the stacked first electrostatic electrode 2231 and second electrostatic electrode 2232, the voltage of the first electrostatic electrode 2231 and the voltage of the second electrostatic electrode 2232 may be at the same potential.

Accordingly, a first capacitance C1 formed by the first electrostatic electrode 2231 is calculated as in Equation 1. Here, a first distance d1 used in calculating the first capacitance C1 is a distance between the bottom surface 220B of the body 220 and the first electrostatic electrode 2231.

Likewise, a second capacitance C2 formed by the second electrostatic electrode 2232 is calculated as in Equation 2.

Here, a second distance d2 used in calculating the second capacitance C2 is a distance between the upper surface 220U of the body 220 and the second electrostatic electrode 2232.

$$C_1 = \epsilon \frac{A}{d_1} \qquad \text{Equation 1}$$

$$C_2 = \epsilon \frac{A}{d_2} \qquad \text{Equation 2}$$

An impedance ZT of the body 220 is calculated as in Equation 3. As the first distance d1 and the second distance d2 decrease, the first capacitance C1 and the second capacitance C2 increase. Since the first capacitance C1 and the second capacitance C2, the impedance ZT decreases.

$$Z_T = \frac{1}{2\pi f C_1} + \frac{1}{2\pi f C_2} \qquad \text{Equation 3}$$

Meanwhile, when one layer of an electrostatic electrode 223A is used in the body 220A as shown in FIG. 4, the capacitance C formed by the electrostatic electrode 223A is calculated as in Equation 4. Here, a distance d used in calculating the capacitance C is a distance between the bottom surface 220B of the body 220A and the upper surface 220U. That is, the distance d corresponds to a thickness of the body 220A.

$$C = \epsilon \frac{A}{d} \qquad \text{Equation 4}$$

The impedance Z of the body 220A shown in FIG. 4 is calculated as in Equation 5.

$$Z = \frac{1}{2\pi f C} \qquad \text{Equation 5}$$

Even when a physical thickness of the body 220 shown in FIG. 3 and a physical thickness of the body 220A shown in FIG. 4 are the same, the first distance d1 and the second distance d2 that are used in calculating the capacitances C1 and C2 in FIG. 3 are less than the distance d used in calculating the capacitance C in FIG. 4. Therefore, the impedance ZT calculated in FIG. 3 is less than the impedance Z calculated in FIG. 4.

In summary, referring to FIG. 3, a voltage applied to the body 220 by the bias power is determined by the impedance ZT of the body 220. The impedance ZT is inversely proportional to the capacitances C1 and C2.

When the electrostatic electrodes 2231 and 2232 which are electrically connected, spaced apart, and stacked on top of each other are used, the capacitances C1 and C2 increase (as compared to the case shown in FIG. 4) and accordingly the impedance decreases. Accordingly, the voltage applied to the body 220 by the bias power is reduced. As a result, the voltage applied to the heat transfer medium supply hole 221 of the body 220 is also reduced and arching does not occur at the heat transfer medium supply hole 221. That is, even when the bias power is sufficiently raised to increase etching productivity, arching does not occur at the heat transfer medium supply hole 221. In addition, it is not required to unnecessarily reduce the size of the heat transfer medium supply hole 221.

Meanwhile, as shown in FIG. 3, the heat transfer medium supply hole 221 may be configured to penetrate the first electrostatic electrode 2231 and the second electrostatic electrode 2232. The heat transfer medium supply hole 221 may be installed in a central region and/or an edge region of the body 220. The vias 2239 may be disposed along the outer circumferential surfaces of the first electrostatic electrode 2231 and the second electrostatic electrode 2232. A first distance L1 from the center of the body 220 to the via 2239 may be greater than a second distance from the center of the body 220 to the heat transfer medium supply hole 221.

Also, the first distance d1 from the first electrostatic electrode 2231 to the bottom surface 220B of the body 220 may be equal to the second distance d2 from the second electrostatic electrode 2232 to the upper surface 220U of the body 220. That is, the first electrostatic electrode 2231 and the second electrostatic electrode 2232 may be installed at positions symmetrical to each other in the thickness direction of the body 220.

Figure 5:
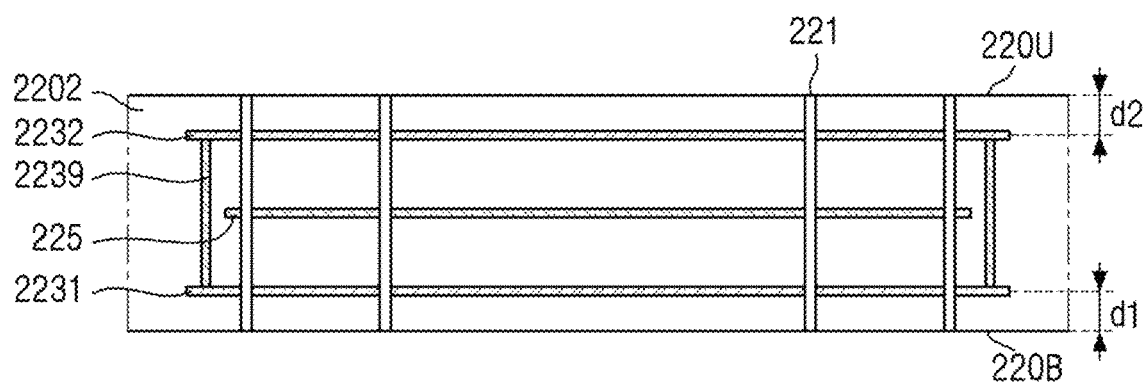
FIG. 5 is a cross-sectional view of a substrate supporting apparatus according to a second embodiment of the present disclosure.

FIG. 5 is a cross-sectional view of a substrate supporting apparatus according to a second embodiment of the present disclosure. For convenience of description, differences from those described with reference to FIGS. 1 to 4 will be mainly described.

Referring to FIG. 5, in a substrate supporting apparatus according to the second embodiment of the present disclosure, a body 2202 includes a first electrostatic electrode 2231, a second electrostatic electrode 2232, a heat transfer medium supply hole 221, and a heater 225.

The heater 225 heats the body 2202. The heater 225 includes a resistor and heat is generated by a current applied to the resistor. The heat generated by the heater 225 is transferred to a substrate and the substrate is maintained at a preset temperature by the heat generated by the heater 225.

The heater 225 may be disposed between the first electrostatic electrode 2231 and the second electrostatic electrode 2232. Accordingly, a first distance d1 between a bottom surface 220B of the body 2202 and the first electrostatic electrode 2231 may be the same as a second distance d2 between an upper surface 220U of the body 2202 and the second electrostatic electrode 2232.

Meanwhile, a heater is not installed in the body 220 shown in FIG. 1 while the heater 225 is installed in the body 2202 shown in FIG. 5. Whether the heat is installed or not may be determined according to the type of etch target material formed on the substrate. For example, when an oxide layer is etched, the body 220 shown in FIG. 1 is used, and when a silicon layer is etched, the body 2202 shown in FIG. 5 is used.

The heat transfer medium supply hole 221 penetrates not only the first electrostatic electrode 2231 and the second electrostatic electrode 2232, but also the heater 225.

Figure 6:
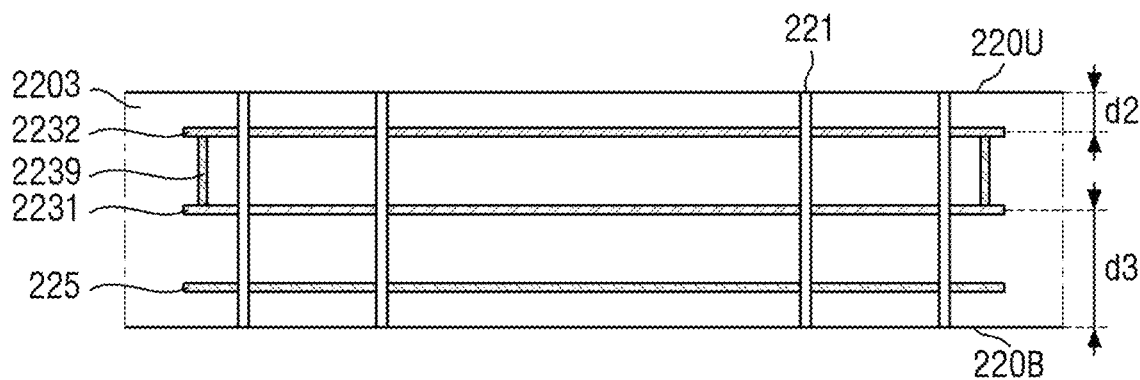
FIG. 6 is a cross-sectional view of a substrate supporting apparatus according to a third embodiment of the present disclosure.

FIG. 6 is a cross-sectional view of a substrate supporting apparatus according to a third embodiment of the present disclosure. For convenience of description, differences from those described with reference to FIGS. 1 to 5 will be mainly described.

Referring to FIG. 6, in a substrate supporting apparatus according to the third embodiment of the present disclosure, a body 2203 includes a first electrostatic electrode 2231, a second electrostatic electrode 2232, a heat transfer medium supply hole 221, and a heater 225.

The heater 225 may be disposed below the first electrostatic electrode 2231. The heater 225 may be disposed between the first electrostatic electrode 2231 and a bottom surface 220B. Accordingly, a third distance d3 between the bottom surface 220B of the body 2203 and the first electrostatic electrode 2231 may be greater than a second distance d2 between an upper surface 220U of the body 2203 and the second electrostatic electrode 2232.

The heat transfer medium supply hole 221 penetrates not only the first electrostatic electrode 2231 and the second electrostatic electrode 2232, but also the heater 225.

Figure 7:
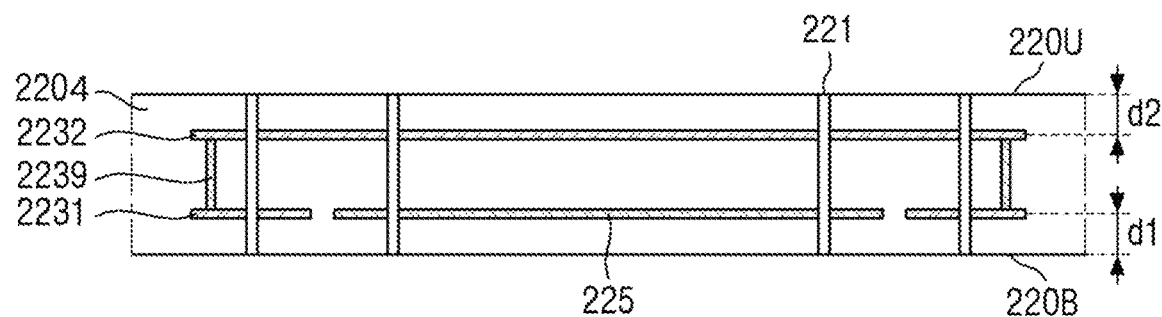
FIG. 7 is a cross-sectional view of a substrate supporting apparatus according to a fourth embodiment of the present disclosure.

FIG. 7 is a cross-sectional view of a substrate supporting apparatus according to a fourth embodiment of the present disclosure. For convenience of description, differences from those described with reference to FIGS. 1 to 6 will be mainly described.

Referring to FIG. 7, in a substrate supporting apparatus according to the fourth embodiment of the present disclosure, a body 2204 includes a first electrostatic electrode 2231, a second electrostatic electrode 2232, a heat transfer medium supply hole 221, and a heater 225.

The first electrostatic electrode 2231 and the heater 225 may be disposed at the same level. That is, a distance from the bottom surface 220B to the first electrostatic electrode 2231 may be substantially the same as a distance from the bottom surface 220B to the heater 225.

Since the first electrostatic electrode 2231 and the heater 225 are disposed at the same level, the surface area of the first electrostatic electrode 2231 is smaller than the surface area of the second electrostatic electrode 2232. Therefore, the impedance of the body 2204 shown in FIG. 7 is greater than the impedance of the body 2202 shown in FIG. 5. However, the thickness of the body 2204 shown in FIG. 7 may be implemented to be thin compared to the thicknesses of the bodies 2202 and 2203 shown in FIGS. 5 and 6, respectively.

When the thickness of the body 2204 is a more important design factor than the impedance of the body 2204, the body 2204 shown in FIG. 7 may be used.

Figure 8:
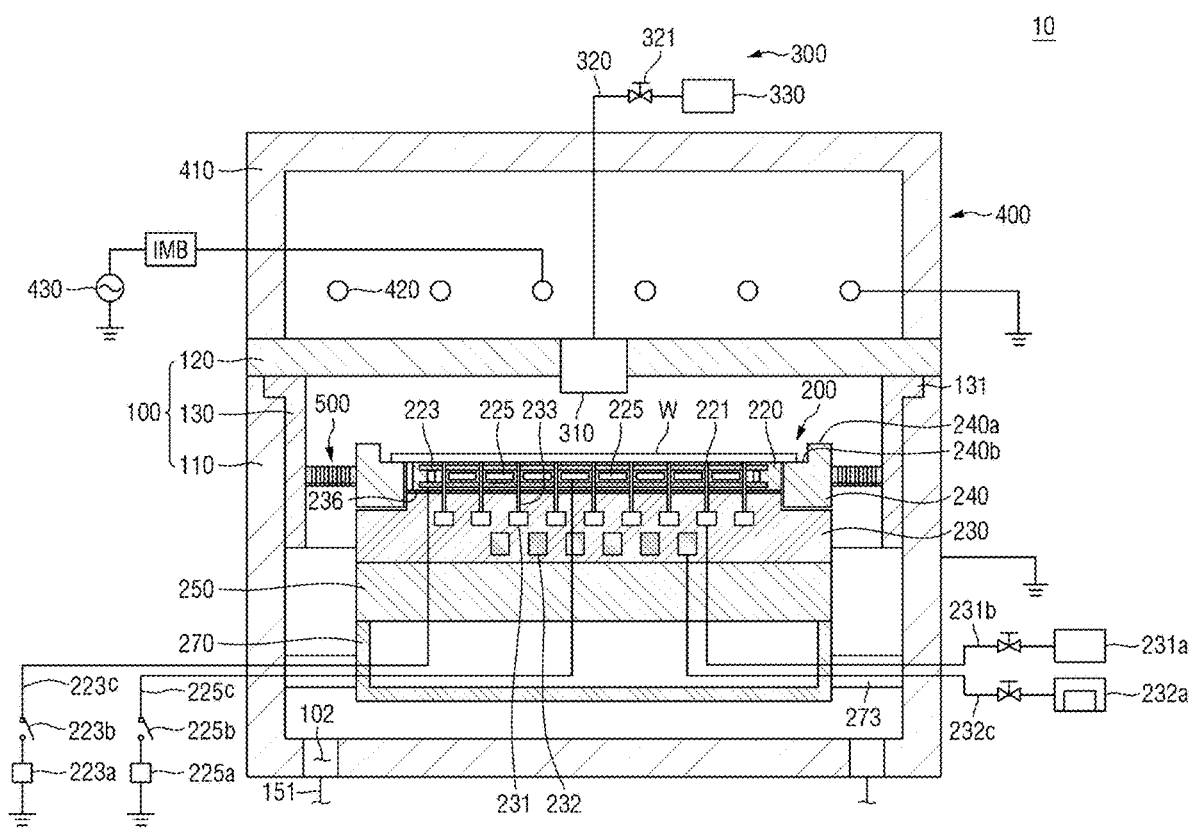
FIG. 8 is a conceptual diagram illustrating a substrate treating apparatus according to some embodiments of the present disclosure.

FIG. 8 is a conceptual diagram illustrating a substrate treating apparatus according to some embodiments of the present disclosure. A substrate processing unit shown in FIG. 8 may be one of the substrate supporting apparatuses described with reference to FIGS. 1 to 7.

Referring to FIG. 8, a substrate treating apparatus 10 according to some embodiments of the present disclosure may process a substrate W using plasma. For example, the substrate treating apparatus 10 may perform an etching process on the substrate W. The substrate treating apparatus 10 includes a chamber 100, a substrate supporting unit 200, a gas supply unit 300, a plasma source 400, and an exhaustion unit 500.

The chamber 100 provides a space in which a substrate treatment process is performed. The chamber 100 includes a housing 110, a cover 120, and a liner 130.

The housing 110 has an open-topped space in the interior thereof. The interior space of the housing 110 is provided as a space in which a substrate treatment process is performed. The housing 110 is formed of a metallic material. The housing 110 may be formed of aluminum. The housing 110 may be grounded. An exhaust hole 102 is formed on a bottom surface of the housing 110. The exhaust hole 102 is connected to an exhaust line 151. The reaction side-products generated in the process and gases left in the interior space of the housing 110 may be discharged to the outside through the exhaust line 151. Through the exhaustion process, the pressure of the interior of the housing 110 is reduced to a specific pressure.

The cover 120 covers an opened upper surface of the housing 110. The cover 120 has a plate shape, and covers the interior space of the housing 110. The cover 120 may include a dielectric substance window.

The liner 130 is provided in the interior of the housing 110. The liner 130 has an interior space with open upper and lower surfaces. The liner 130 may have a cylindrical shape. The liner 130 may have a radius corresponding to an inner surface of the housing 110. The liner 130 is provided along the inner surface of the housing 110. A support ring 131 is formed at an upper end of the liner 130. The support ring 131 is a ring-shaped plate, and protrudes to the outside of the liner 130 along the circumference of the liner 130. The support ring 131 is positioned at an upper end of the housing 110, and supports the liner 130. The liner 130 may be formed of the same material as the housing 110. The liner 130 may be formed of aluminum. The liner 130 protects the inner surface of the housing 110. In a process of exciting a process gas, arc discharging may be generated in the interior of the chamber 100. The arc discharging damages peripheral devices. The liner 130 prevents an inner surface of the housing 110 from being damaged due to arc discharging by protecting the inner surface of the housing 110. Also, the liner 130 prevents the reaction side-products generated in the substrate treating process from being deposited on the inner wall of the housing 110. When the liner 130 is damaged due to arc discharging, an operator may exchange the liner 130 with a new liner 130.

The gas supply unit 300 supplies a process gas into the interior of the chamber 100. The gas supply unit 300 includes a gas supply nozzle 310, a gas supply line 320, and a gas storage unit 330. The gas supply nozzle 310 is installed at a central portion of the cover 120. An ejection hole is formed on the bottom surface of the gas supply nozzle 310. The ejection hole is located below the cover 120, and supplies the process gas into the interior of the chamber 100. The gas supply unit 320 connects the gas supply nozzle 310 to the gas storage unit 330. The gas supply line 320 supplies the process gas stored in the gas storage unit 330 to the gas supply nozzle 310. A valve 321 is installed in the gas supply line 320. The valve 321 opens and closes the gas supply line 320, and adjusts a flow rate of the process gas supplied through the gas supply line 320.

The plasma source 400 is disposed above the substrate supporting unit 200. The plasma source 400 excites the process gas in the chamber 100 into a plasma state. An inductively coupled plasma (ICP) source may be used as the plasma source 400. The plasma source 400 includes an antenna chamber 410, an antenna 420, and a plasma power source 430.

The antenna 420 serves as an upper electrode disposed above the substrate supporting unit 200. The antenna 420 may be provided outside the housing 110.

The antenna chamber 410 has an open-bottomed cylindrical shape. The antenna chamber 410 has a space in the interior thereof. The antenna chamber 410 has a diameter corresponding to the chamber 100. A lower end of the antenna chamber 410 may be provided to be detachable from the cover 120.

The antenna 420 is disposed in the interior of the antenna chamber 410. The antenna 420 is a spiral coil that is wound a plurality of times. However, the shape and number of the antenna may vary. The antenna 420 is connected to the plasma power source 430. An impedance matching box (IMB) may be disposed between the plasma power source 430 and the antenna 420. The antenna 420 is supplied with electric power from the plasma power source 430. For example, RF electric power may be applied to the antenna 420. When RF electric power is applied, the antenna 420 of the plasma source 400 generates plasma from the process gas in the treatment space of the chamber 100. That is, the process gas is excited into a plasma state by an electromagnetic field.

The substrate supporting unit 200 is located in the interior of the housing 110. The substrate supporting unit 200 supports the substrate W. The substrate supporting unit 200 may include an electrostatic chuck that suctions the substrate W by using an electrostatic force.

The substrate supporting unit 200 includes a lower cover 270, an insulating plate 250, a lower plate 230, a body 220, a focus ring 240, and the like. The substrate supporting unit 200 may be upwardly spaced apart from the bottom surface of the housing 110 in the interior of the chamber 100.

As described above, the body 220 may be formed of a dielectric substance of a disk shape. The substrate W is placed on the upper surface of the body 220. The upper surface of the body 220 may have a diameter that is smaller than that of the substrate W. A first supply passage 221 (i.e., a heat transfer medium supply hole) is formed in the body 220. A plurality of first supply passages 221 are formed to be spaced apart from each other, and are provided as passages through which a heat transfer medium is supplied to the bottom surface of the substrate W.

An electrostatic electrode 223 is buried in the body 220. The electrostatic electrode 223 may include a first electrostatic electrode, a second electrostatic electrode disposed on the first electrostatic electrode, and a via connecting the first electrostatic electrode to the second electrostatic electrode. The electrostatic electrode 223 is electrically connected to a first lower power source 223a. The first lower power source 223a includes a direct current (DC) power source. A switch 223b is installed between the electrostatic electrode 223 and the first lower poser source 223a. The electrostatic electrode 223 may be electrically connected to the first lower power source 223a by ON/OFF of the switch 223b. When the switch 223b is turned on, a DC current is applied to the electrostatic electrode 223. An electrostatic force is applied between the electrostatic electrode 223 and the substrate W by a current applied to the electrostatic electrode 223, and the substrate W is suctioned to the body 220 by the electrostatic force.

The heater 225 is located in the body 215. The heater may be disposed, for example, between the first electrostatic electrode and the second electrostatic electrode. The heater 225 heats the body 215. The heater 225 is heated by application of an alternating current (AC). That is, the heater 225 generates a heat by resisting the applied current. The generated heat is transferred to the substrate W through the body 220. The substrate W is maintained at a predetermined temperature by the heat generated by the heater 225. The heater 225 is electrically connected to a second lower power source 225a. An AC current is selectively provided to the heater 225 by ON/OFF of the switch 225b.

A circulation passage 231, a cooling passage 232, and a second supply passage 233 are formed in the lower plate 230. The circulation passage 231 is provided as a passage through which the heat transfer medium circulates. The cooling passage 232 cools the body. The cooling passage 232 is provided as a passage through which a cooling fluid circulates. The circulation passage 231 is connected to the heat transfer medium storage unit 231a through a heat transfer medium supply line 231b. The heat transfer medium storage unit 231a stores a heat transfer medium. The meat transfer medium includes an inert gas. According to the embodiments, the heat transfer medium include a helium (He) gas. The helium gas is supplied to the circulation passage 231 through the supply line 231b and supplied to the bottom surface of the substrate W, sequentially passing through the second supply passage 233 and the first supply passage 221. The helium gas serves as a medium through which the heat transferred to the substrate W from plasma is transferred to an electrostatic chuck. The focus ring 240 is disposed in a peripheral region of the electrostatic chuck. The focus ring 240 has a ring shape and is disposed along the circumference of the body 220. One surface 240a of the focus ring 240 may be configured to protrude more than the substrate W and the other surface 240b of the focus ring 240 may be configured to make contact with an edge of the substrate W.

The insulating plate 250 is located below the lower plate 230. The insulating plate 250 is made of an insulating material, and electrically insulates the lower plate 230 from the lower cover 270. The lower cover 270 includes a connecting member 273. The connecting member 273 is connected to an inner wall of the housing 110 such that the lower cover 270 is electrically grounded. A first power line 223c connected to the first lower power source 223a, a second power line 225c connected to the second lower power source 225a, the heat transfer medium supply line 231b connected to the heat transfer medium storage 231a, and a cooling fluid supply line 232c connected to a cooling fluid storage 232a extend into the lower cover 270 through the interior space of the connecting member 273.

The exhaustion unit 500 is located between the inner wall of the housing 110 and the substrate supporting unit 200. The exhaustion unit 500 includes an exhaustion plate having a through-hole. The exhaustion plate has an annular ring shape and has a plurality of through-holes. The process gas provided into the housing 110 passes through through-holes of the exhaustion plate and is exhausted through the exhaust hole 102.

The substrate supporting unit 200 shown in FIG. 8 is illustrated using the body 2202 shown in FIG. 5 by way of an example, but the present disclosure is not limited thereto. As the substrate supporting unit 200, the body 220 shown in FIG. 3, the body 2203 shown in FIG. 6, or the body 2204 shown in FIG. 7 may be used.

FIG. 8 is illustrates an ICP plasma apparatus, but the present disclosure may be applied to a capacitively coupled plasma (CCP) apparatus.

While various embodiments have been described, those skilled in the art will appreciate that many variations and modifications can be made to the preferred embodiments without substantially departing from the principles of the present disclosure. Therefore, the disclosed preferred embodiments of the invention are used in a generic and descriptive sense only and not for purposes of limitation.

What is claimed:
1. A substrate supporting apparatus comprising:
a body configured to support a substrate and formed of a dielectric substance;
a heat transfer medium supply hole installed to penetrate the body;
a first electrostatic electrode disposed in the body; and
a second electrostatic electrode disposed in the body, located on the first electrostatic electrode, and electrically connected to the first electrostatic electrode, wherein a surface area of the first electrostatic electrode is smaller than a surface area of the second electrostatic electrode, and wherein the first electrostatic electrode and a heater are disposed at a same level.

2. The substrate supporting apparatus of claim 1, wherein a first distance from the first electrostatic electrode to a bottom surface of the body is the same as a second distance from the second electrostatic electrode to an upper surface of the body.

3. The substrate supporting apparatus of claim 1, wherein the heat transfer medium supply hole is configured to penetrate the first electrostatic electrode and the second electrostatic electrode.

4. The substrate supporting apparatus of claim 1, further comprising a via in direct contact with the first electrostatic electrode and the second electrostatic electrode.

5. The substrate supporting apparatus of claim 4, wherein a first distance from a center of the body to the via is greater than a second distance from the center of the body to the heat transfer medium supply hole.

6. The substrate supporting apparatus of claim 1, further comprising a lower plate formed of a metallic material and installed below the body, wherein a cooling passage through which a cooling fluid circulates is installed in an interior of the lower plate.

7. A substrate supporting apparatus comprising:
a body configured to support a substrate and formed of a dielectric substance; and
a lower plate disposed below the body, fixed to the body by a bonding layer, and formed of a metallic material, wherein:
a first electrostatic electrode, a second electrostatic electrode positioned on the first electrostatic electrode, a via in direct contact with the first electrostatic electrode and the second electrostatic electrode, a heat transfer medium supply hole configured to penetrate the first electrostatic electrode and the second electrostatic electrode are installed in an interior of the body, a cooling passage through which a cooling fluid circulates is installed in an interior of the lower plate, and
a first distance from the first electrostatic electrode to a bottom surface of the body is the same as a second distance from the second electrostatic electrode to an upper surface of the body,
wherein a surface area of the first electrostatic electrode is smaller than a surface area of the second electrostatic electrode, and
wherein the first electrostatic electrode and a heater are disposed at a same level.

8. The substrate supporting apparatus of claim 7, wherein a first distance from a center of the body to the via is greater than a second distance from the center of the body to the heat transfer medium supply hole.

9. A substrate treating apparatus comprising:
a housing;
a substrate supporting unit provided in an interior of the housing and configured to support a substrate;
a gas supply unit configured to provide a process gas into the housing; and
a plasma source having an electrode configured to be applied a radio frequency (RF) current and generate plasma using the process gas,
wherein the substrate supporting unit includes
a body configured to support a substrate and formed of a dielectric substance,
a heat transfer medium supply hole installed to penetrate the body,
a first electrostatic electrode disposed in the body; and
a second electrostatic electrode disposed in the body, located on the first electrostatic electrode, and electrically connected to the first electrostatic electrode,
wherein a surface area of the first electrostatic electrode is smaller than a surface area of the second electrostatic electrode, and
wherein the first electrostatic electrode and a heater are disposed at a same level.

10. The substrate treating apparatus of claim 9, wherein a first distance from the first electrostatic electrode to a bottom surface of the body is the same as a second distance from the second electrostatic electrode to an upper surface of the body.

11. The substrate treating apparatus of claim 9, wherein the heat transfer medium supply hole is configured to penetrate the first electrostatic electrode and the second electrostatic electrode.

12. The substrate treating apparatus of claim 9, further comprising a via in direct contact with the first electrostatic electrode and the second electrostatic electrode.

13. The substrate treating apparatus of claim 12, wherein a first distance from a center of the body to the via is greater than a second distance from the center of the body to the heat transfer medium supply hole.

* * * * *